United States Patent

Oyama

[11] Patent Number: 5,546,339
[45] Date of Patent: Aug. 13, 1996

[54] NONVOLATILE SEMICONDUCTOR MEMORY DEVICE EQUIPPED WITH MEANS FOR SUPPRESSING DRAIN DISTURBANCE PHENOMENON

[75] Inventor: Ken-Ichi Oyama, Tokyo, Japan

[73] Assignee: NEC Corporation, Tokyo, Japan

[21] Appl. No.: 439,458

[22] Filed: May 11, 1995

Related U.S. Application Data

[62] Division of Ser. No. 331,374, Oct. 28, 1994.

[30] Foreign Application Priority Data

Oct. 29, 1993 [JP] Japan .................................. 5-271108

[51] Int. Cl.$^6$ ........................................... G11C 11/34
[52] U.S. Cl. .................... 365/185.02; 365/185.11; 365/185.13; 365/185.18
[58] Field of Search ........................... 365/185, 218, 365/900, 230.03, 185.02, 185.11, 185.12, 185.13, 185.18

[56] References Cited

U.S. PATENT DOCUMENTS

| | | | |
|---|---|---|---|
| 5,267,196 | 11/1993 | Talreja et al. | 365/230.03 |
| 5,384,742 | 1/1995 | Miyakawa et al. | 365/218 |
| 5,428,568 | 6/1995 | Kobayashi et al. | 365/185 |

*Primary Examiner*—David C. Nelms
*Assistant Examiner*—Huan Hoang

[57] ABSTRACT

When a write operation is indicated, a control circuit which receives the power supply voltage, generates a write control signal C, two power source voltages V1 and V2 for write which are 2 V and 10 V, respectively. Upon receipt of the write control signal C a row decoder 103 brings the word line corresponding to the memory cell transistor to be written in to 10 V and the other wordlines to 2 V. Upon receipt of the write control signal C a source line control circuit 105 brings the source line corresponding to the memory cell transistor to be written in to 0 V and the other source lines to 5 V.

2 Claims, 3 Drawing Sheets

NONVOLATILE SEMICONDUCTOR MEMORY DEVICE EQUIPPED WITH MEANS FOR SUPPRESSING DRAIN DISTURBANCE PHENOMENON

This is a division of application Ser. No. 08/331,374, filed Oct. 28, 1994.

BACKGROUND OF THE INVENTION

1. Field of the Invention

The present invention relates to a nonvolatile semiconductor memory device, and more particularly to a nonvolatile semiconductor memory device, such as a flash memory, having a floating gate electrode.

2. Description of the Related Art

A nonvolatile semiconductor device, such as a flash memory, having a floating gate electrode is expected to be useful in the future as a replacement candidate for a magnetic memory medium such as a hard disk or a floppy disk for the reasons of nonvolatility, low power consumption, high level of integration and the possibility of low cost per bit.

Each memory cell of the above kind of nonvolatile semiconductor memory device consists of a memory cell transistor, and, as shown in FIG. 3, each transistor is constituted of a tunned oxide film 302 on a P-type silicon substrate 301 formed by thin film formation technology due to silicon thermal oxidation technology and CVD method, photolithography technology and thin film dry etching technology, a polycrystalline silicon double layer gate consisting of a floating gate 303 formed of polycrystalline silicon, a layer insulating film 304 and a control gate 305 formed of polycrystalline silicon, and a source diffused layer 307 and a drain diffused layer 306 formed using phosphorus or arsenic ion implantation technology.

The floating gate 303 is a gate for varying the threshold of the memory cell transistor from the control gate 305. When hot electrons are accumulated in the floating gate 303, a positive potential given to the control gate 305 is canceled by the hot electrons accumulated in the floating gate 303, so that the threshold of the memory cell transistor from the control gate 305 becomes higher compared with the state in which hot electrons are not accumulated.

An injection of the hot electrons to the floating gate 303 is accomplished by applying 10 V, 5 V and 0 V to the control gate 305, drain 306 and source 307, respectively. Thus, some of the electrons migrating in the channel of the memory cell transistor reach the floating gate 303 passing through the tunnel oxide film 302, and are accumulated there. Such a state in which hot electrons are accumulated in the floating gate 303 represents the data write state. On the contrary, the ejection of the hot electrons from the floating gate 303 brings the drain 306 to an electrically open condition (floating condition), which can be realized by applying 5 V to the source 307 and −16 V to the control gate 305. With this arrangement, Fowler-Nordheim current which is the tunneling current of the tunnel oxide film 302 in the overlapped region of the source diffused layer 307 and the floating gate 303 is generated to expel the electrons from the floating gate 303 via the tunneling oxide film 302. Such a state in which there is accumulated no hot electron in the floating gate 303 represents the data erase state.

In addition, data read is performed by applying 5 V, 1 V and 0 V to the control gate 305, drain 306 and source 307, respectively. At that time, if the memory cell transistor is in the write state, namely, if it is in a state where hot electrons are accumulated in the floating gate 303, the voltage of 5 V given to the control gate 305 is canceled by the hot electrons so that the memory cell transistor does not go to the conducting state, whereas, if the memory cell transistor is in the erase state, namely, if it is in the state where hot electrons are not accumulated in the floating gate 303, the memory cell transistor goes to the conducting state due to the voltage given to the control gate 305. Accordingly, data read from the memory transistor can be carried out by detecting such conduction or nonconduction.

In FIG. 4 is shown an example of the conventional nonvolatile semiconductor memory device. In the nonvolatile semiconductor memory device shown in the figure, for ease of description, there is illustrated a case in which the memory device comprises memory cell transistors M11 to M43 divided into blocks 401 and 402 according to the unit of batch erasure of data. Bit lines B1 to B3 which are connected in common to the drain electrodes of the memory cell transistors M11, M21, M31 and M41, memory cell transistors M12, M22, M32 and M42 and memory cell transistors M13, M23, M33 and M43, respectively. Word lines W1 to W4 which are connected in common to the control gate electrodes of the memory cell transistors M11, M12 and M13, memory cell transistors M21, M22 and M23, memory cell transistors M31, M32 and M33 and memory cell transistors M41, M42 and M43, respectively. Source lines S1 to S4 which are connected in common to the source electrodes of the memory cell transistors M11, M12 and M13, memory cell transistors M21, M22 and M23, memory cell transistors M31, M32 and M33 and memory cell transistors M41, M42 and M43, respectively. A column decoder 403 which decodes column addresses AC in response to a write control signal C and controls so as to select one of the bit lines B1 to B3, a row decoder 404 which decodes row addresses AR and controls so as to select one of the word lines W1 to W4, and a source line control circuit 405 which controls the voltages of the source lines S1 and S2, and S3 and S4 of the blocks 401 and 402, respectively, in response to write and erase of data.

Next, the operation of the memory device will be described. In writing data to the memory cell transistor M11 which is the object of write, 10 V, 5 V and 0 V are applied to the word line W1, the bit line B1 and the source line S1, respectively, which are connected to the memory cell transistor M11. The other word lines W2 to W4 and the other source lines S2 to S4 are supplied with 0 V and the other bit lines B2 and B3 are brought to the open state.

As a result, the control gate, the drain and the source of the memory cell transistor M11 which is the write object are supplied with 10 V, 5 V and 0 V, respectively, so that hot electrons are injected to the floating gate of the memory cell transistor M11, and the device is ready to perform writing.

However, if the memory cell transistor M21, M31 or M41 which shares the bit line with the memory cell transistor M11, is already in the write state, it is given 5 V to its drain diffused layer through the bit line B1 at the time of writing data to the memory cell transistor M11, so that there is generated a strong electric field between the floating gate and the drain diffused layer of the memory cell transistor which is already in the write state.

Therefore, an electric field distorts the energy band in the overlapped region of the floating gate and the drain diffused layer. This distortion gives rise to the drain disturbance phenomenon in which the electrons and the holes of the electron-hole pairs created by the energy band distortion are injected to the drain diffused layer and the floating gate, respectively (Anirban Roy, Reliability Physics 30th Annual Proceedings, 1992, pp. 68–75). When the drain disturbance phenomenon occurs, the data is converted from the write state to the erase state because of the decrease in the quantity of accumulated charge in the floating gate.

Since a memory cell transistor in the write state is subjected to the drain disturbance phenomenon whenever the write operation is performed to a memory transistor which shares the same bit line, the length of time subjected to the drain disturbance phenomenon can be represented by, the number of memory cell transistors on a common bit line X number of times of data write to memory cell transistors on the common bit line X data write time. In reality, however, the number of times of data rewrite to the memory cell transistors on the common bit line amounts to about one hundred thousand times to one million times so that it is impossible to hold the write data.

Suppression of the drain disturbance can be accomplished by setting the voltage applied to the bit line B1 for driving the memory cell transistor M11 to be lower than 5 V. Moreover, the resistance to the drain disturbance of the memory cell transistor can be improved while maintaining the rate of data write by optimizing the structure of the drain (Akinori Kodama, Technical Digest of International Electron Devices Meeting, 1991, pp. 303–306).

However, when the voltage applied to the bit line B1 for driving the memory cell transistor M11 is set low at 4 V, for example, in order to suppress the drain disturbance, the rate of data write to the memory cell transistor M11 becomes low by about one order of magnitude compared with the case of application of 5 V to the bit line, sharply deteriorating the write efficiency.

Further, when the drain structure is optimized for the purpose of suppressing the drain disturbance, the drain structure becomes extremely complicated, making the manufacturing process complicated and long.

SUMMARY OF THE INVENTION

It is therefore the object of this invention to suppress the drain disturbance phenomenon without lowering the voltage applied to the bit line at the time of data write, and without introducing a complicated structure to the memory cell transistor, and let the memory device positively hold the writing data.

A nonvolatile semiconductor memory device according to this invention is equipped with a means which makes the voltage of the word lines other than the word line corresponding to the memory cell transistor of the write object to be lower than the threshold voltage of the memory cell transistor and higher than the source voltage of the memory cell transistor which is the object of write.

Therefore, even if other memory cell transistors sharing the same bit line with the memory cell transistor which is the object of writing are in the write state, the above-mentioned voltage is applied to such other memory cell transistors, so that the electric field generated between the floating gate and the drain diffused layer can be relaxed through the capacitive coupling of such other memory cell transistors with the floating gate.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Figure 1:
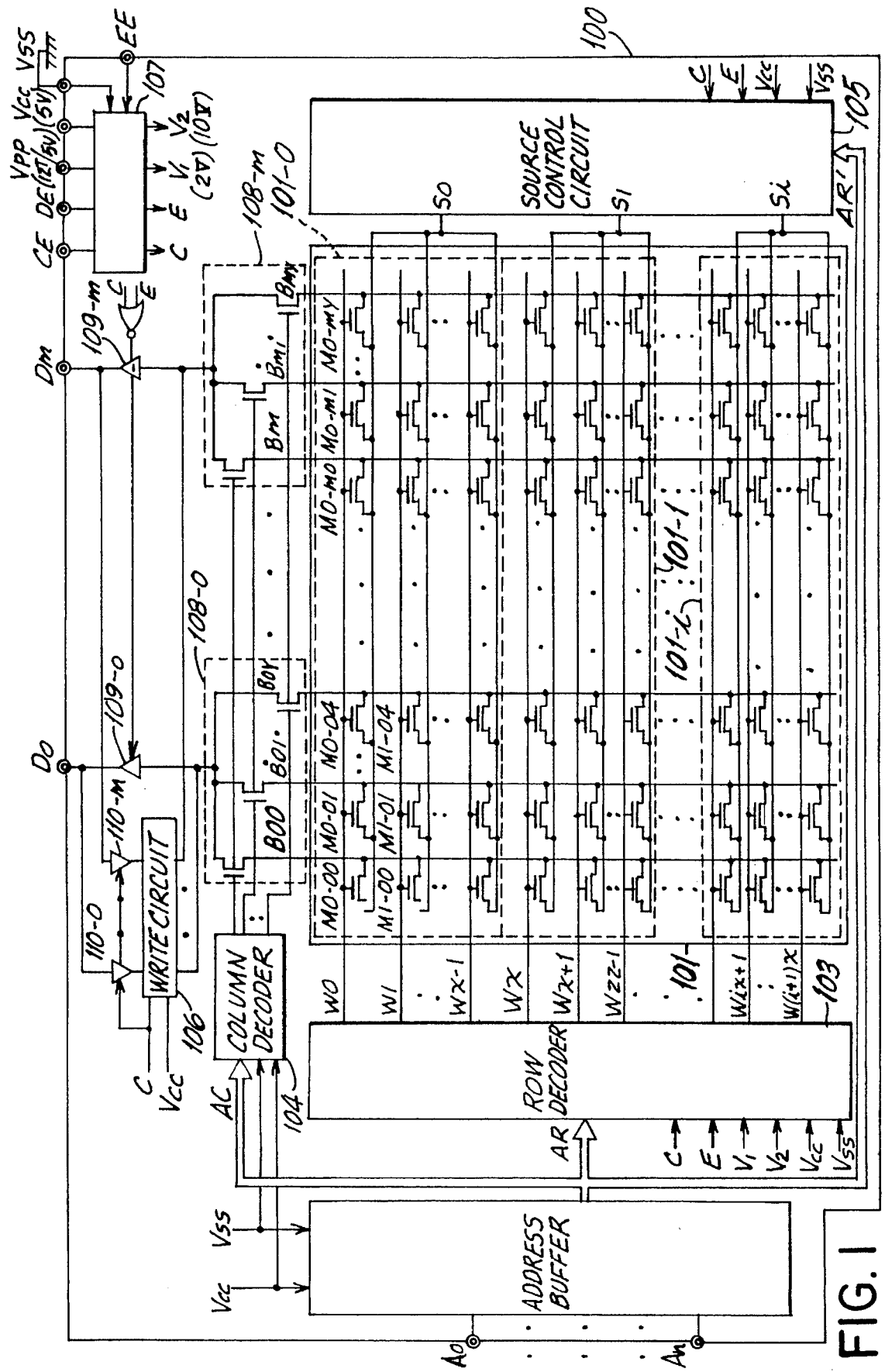
FIG. 1 is a block diagram showing an embodiment of the nonvolatile semiconductor memory device according to the invention.

The nonvolatile semiconductor memory device 100 according to this invention includes a cell array region 101 composed of a plurality of memory cell transistors having respective floating gates, a row decoder 103 which selects one out of a plurality of word lines by decoding row addresses AR, a column decoder 104 which selects one out of a plurality of column selection lines by decoding column addresses AC and a source line control circuit 105 which controls the potential of a plurality of source lines by decoding addresses AR' which are a part of the row addresses AR. The nonvolatile semiconductor memory device further, includes a control circuit 107 which generates various kinds of control signals and write source voltages V1 and V2 by receiving power supply voltages (VPP, VCC and VSS), a chip enable signal (CE), an output enable signal (OE) and an erase signal (EE). The cell array region 101 consists of memory cell transistors arranged in the form of a matrix of x X (i+1) rows X (y+1) X (m+1) columns. That is to say, each word line is connected in common to the control gates of (y+1) X (m+1) memory cell transistors, and each bit line is connected in common to the drain diffused layers of x X (i+1) memory cell transistors. In addition, the cell array region 101 is divided into i+1 blocks 101-0 to 101-i with a memory cell transistor group connected to x word lines as a unit, and the source potential of the memory cell transistors within each block is batch-controlled by the corresponding source line. As a result, erasure of data written to the memory cell transistors is carried out in one shot with the block as a unit.

Moreover, the nonvolatile semiconductor memory device 100 discriminates write, read and erase of data by detecting the logical level of the power supply voltage (VPP), the chip enable signal (CE), the output enable signal (OE) and the erase signal (EE) with the control circuit 107. The write operation is indicated when the power supply voltage (VPP) is at the high voltage (12 V), and the chip enable signal (CE) is active and the output enable signal (OE) and the erase signal (EE) are inactive. When the write operation is indicated by the above conditions, the control circuit 107 brings the write control signal C to the high level, and generates power source voltages V1 and V2 for write which are 2 V and 10 V, respectively. In addition, when the erase operation is indicated, the control circuit 107 brings the erase control signal E to the high level.

Since the nonvolatile semiconductor memory device according to this invention has a feature in the operation of the row decoder 103 and the source line control circuit 105 at the time of the write operation and performs the well-known operation at the time of read operation and erase operation, only the operation at the time of write will be described in the following.

At the write operation, namely, when the write control signal C and the power source voltages V1 and V2 are generated, the row decoder 103 decodes the row address AR supplied from an address buffer 102, and supplies the potential V2 to one word line out of the word lines W0 to W(i+1)x, and the potential V1 to the remaining word lines. The column decoder 104 decodes column address AC supplied from the address buffer 102, selects one out of a plurality of column selection lines to bring it to the active level. On the other hand, when the write control signal C is supplied, the source line control circuit 105 decodes a part AR' of the row address supplied from the address buffer 102, and supplies the VSS potential to one source line out of the source lines So to Si and the VCC potential to the remaining source lines. Further, when there is generated a write control signal C, a write circuit 106 brings the output corresponding to the bit to be written to the VCC potential and the outputs corresponding to the bits not to be written to high impedance based on write data supplied via tristate buffers 110-0 to 110-m. Reference numerals 109-0 to 109-m are respectively sense amplifiers served also as tristate buffers used in read operation.

Next, a specific write operation will be described taking the case of write to the memory cell transistors M0-00 and M1-00 as an example. As shown in the figure, the memory cell transistor M0-00 is connected to the word line W0 and the bit line B00, and the memory cell transistor M1-00 is connected to the word line W1 and the bit line B00. First, in order to write data to the memory cell transistor M0-00, based on the addresses from the address buffer 102, W0, B00 and S0 are selected respectively, by the row decoder 103, the column decoder 104 and the source line control circuit 105. Accordingly, the word line W0 goes to the V2 potential, namely, 10 V, while the other word lines go to the V1 potential, namely, 2 V. Moreover, the bit line B00 goes to the VCC potential, namely, 5 V, while the other bit lines go to the floating state. Further, the source line S0 goes to the VSS potential, namely, 0 V, while the other source lines go to the VCC potential, namely, 5 V. As a result, the potentials of the control gate, drain diffused layer and the source diffused layer of the memory cell transistor M0-00 become 10 V, 5 V and 0 V, respectively, so that the write operation can be performed. At that time, the potentials of the control gate, the drain diffused layer and the source diffused layer of the memory cell transistor M1-00 which shares the same bit line are 2 V, 5 V and 0 V, respectively. Next, in order to write data to the memory cell transistor M1-00 W1, B00 and S0 are selected as the word line, the bit line and the source line, respectively. Accordingly, the word line W1 goes to the V2 potential, namely, 10 V, while the other word lines go to the V1 potential, namely, 2 V. In addition, the bit line B00 goes to the VCC potential, namely, 5 V, while the other bit lines go to the floating state. Further, the source line S0 goes to the VSS potential, namely, 0 V, while the other source lines go to the VCC potential, namely, 5 V. In this way, the potentials of the control gate, the drain diffused layer and the source diffused layer of the memory cell transistor M1-00 become 10 V, 5 V and 0 V, respectively, so that the write operation can take place. At that time, the potentials of the control gate, the drain diffused layer and the source diffused layer of the memory cell transistor M0-00 which shares the same bit line and is in the write state are 2 V, 5 V and 0 V, respectively. If one focuses his attention on the memory cell transistor M0-00, the potential of the floating gate is normally about −2.5 V since the hot electrons are injected into the floating gate. However, when a voltage of 2 V is applied to the control gate as in the above, the potential of the control gate becomes about −1 V only during the time when the potential is applied to the control gate, due to the capacitive coupling between the control gate and the floating gate. Because of this, the electric field between the potential of the floating gate and the drain diffused layer to which is applied a potential of 5 V, is relaxed sharply compared with the case when there is not applied a potential of 2 V to the control gate.

Figure 2:
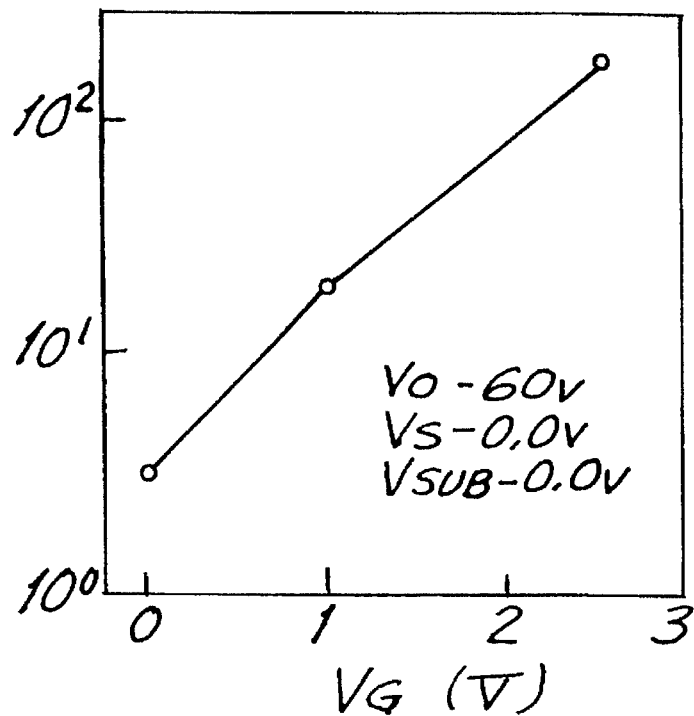
FIG. 2 is a characteristic chart showing an example of improvement of the drain disturbance resistance of the embodiment.
Figure 3:
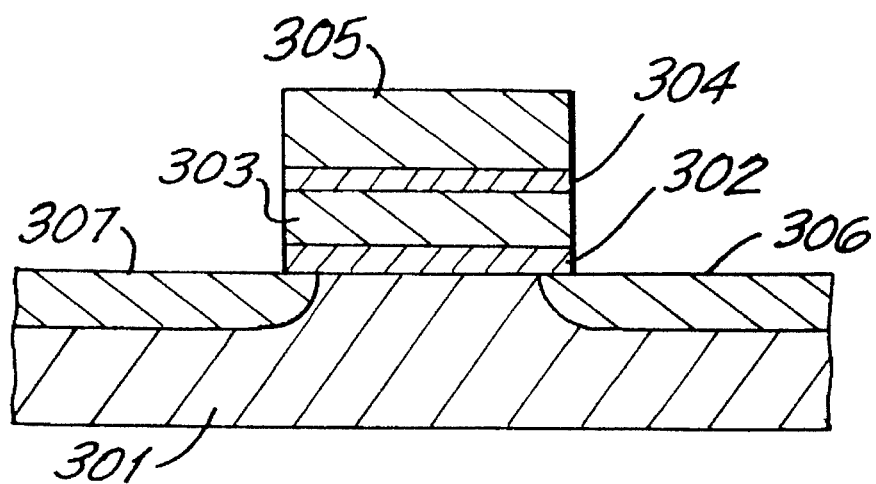
FIG. 3 is a schematic sectional view of the memory cell transistor of the nonvolatile semiconductor memory device.
Figure 4:
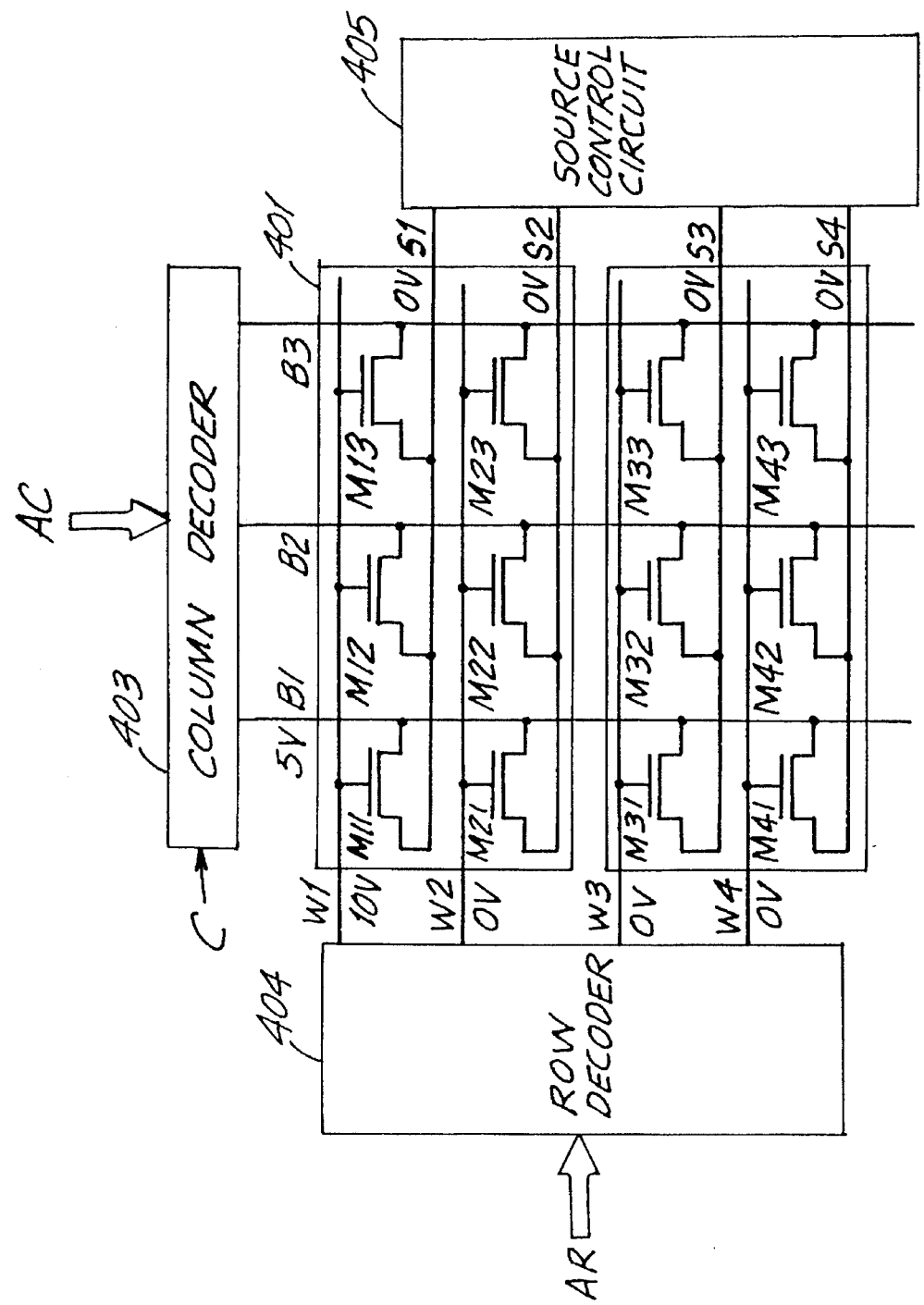
FIG. 4 is a block diagram showing the conventional nonvolatile semiconductor memory device.

Here, referring to FIG. 2 which shows drain disturbance resistance of the memory cell transistor when a low positive voltage is applied to the control gate, where the drain disturbance resistance is defined to be the time for the threshold of a memory cell transistor in the write state to change from 8 V to 7 V due to the drain disturbance phenimenon, it can be seen that the drain disturbance resistance is improved by about one order of magnitude for every rise of 1 V in the voltage of the control gate connected to the word line. In other words, the drain disturbance resistance can be improved by about two orders of magnitude by applying 2 V to the word lines corresponding to the memory cells that are not the object of write.

Therefore, while performing normal write to the memory cell transistor M1-00 which is the write object, it is possible not to give damage to the write data of the memory cell transistor M0-00 which was already in the write state.

Moreover, among the memory cell transistors sharing the same bit line with the memory cell transistor M1-00 which is the write object, those contained in the blocks 101-1 to 101-i other than that of the write object, for example, the memory cell transistor M(x+1)-00, have equal source and drain potentials because the potentials of the source lines S1 to Si corresponding to the blocks 101-1 to 101-i other than the write object are all 5 V, so that there will not be generated channel currents.

It should be noted in this embodiment that the potential of the nonselected word lines was set at 2 V. While the drain disturbance resistance can be improved by raising the potential applied to the control gate, the choice of 2 V is based on the consideration on the fear that the memory cell transistors, especially those in the erase state, may go to the conducting state if too high a potential is applied, which may lead to the increase in the power consumption. It is considered that if the potential is about 2 V, there is no possibility of the memory cell transistors in the erase state going to the conducting state, and at the same time the drain disturbance phenomenon can be suppressed effectively.

Furthermore, as another embodiment of this invention, a case may be considered in which, among the word lines in the block including a memory cell transistor of the write object, the potential of the word lines except for the word line corresponding to the memory cell transistor of the write object is set to be 0 V, and the potential of the word lines of the blocks that do not contain the memory cell transistor of the write object is set to be 2 V. In that case, among the memory cell transistors within the block including the memory cell transistor of the write object, the potentials of the control gate, the drain diffused layer and the source diffused layer of the memory cell transistors sharing the same bit line with the memory cell transistor of the write object become 0 V, 5 V and 0 V, respectively, so that it is possible to reduce the channel current due to the potential difference between the source and the drain to be substantially equal to zero. In this embodiment, among the memory cell transistors within the block that includes the memory cell transistor of the write object, the memory cell transistors that share the same bit line with the memory cell transistor of the write object are subject to the influence of the drain disturbance phenomenon. Since, however, the source lines are batch-controlled for every block, the memory cell transistors that are affected by the drain disturbance phenomenon are limited only to those memory cell transistors within one block, and the influence of the phenomenon does not amount too much. In other words, the duration over which they are subjected to the drain disturbance phenomenon is shortened in inverse proportion to the number of the blocks, so that it is possible to minimize the influence of the drain disturbance phenomenon.

Moreover, although use has been made of a silicon film as the semiconductor film constituting the memory cell transistor, a silicon oxide film as the insulating film and a silicon substrate as the semiconductor substrate, different kind of semiconductor film and semiconductor substrate material may be used and a silicon nitride film, a phosphate glass film or a silicon oxynitride film may be used as the insulating film. Still further, 10 V, 5 V and 2 V have been used as the supply potentials for various electrodes of the memory cell transistors, but other appropriate potentials may be supplied. Namely, although the potential to be supplied to the nonselected word line is chosen to be 2 V, a potential higher than 2 V may be used when the suppression of the drain disturbance phenomenon is especially required rather than reduction of the power consumption, whereas a potential lower than 2 V may be used when the reduction in the power consumption is the highest priority item. In other words, the potential may be appropriately set within the range of higher than the VSS potential and lower than the VCC potential.

What is claimed is:

1. A nonvolatile semiconductor memory device comprising c sets of memory blocks each including a word lines, b bit lines, and a x b memory cell transistors arranged at intersections of said word lines and said bit lines; a plurality of source lines; a row decoder which selects one word line based on a row address; a column decoder which selects one bit line based on a column address; and a source line control circuit which selects one source line of said plurality of source lines, based on a part of said row address, wherein:

each of said memory cell transistors comprises a floating gate, a control gate electrode connected to a corresponding one of said word lines, a drain electrode connected to a corresponding one of said bit lines and a source electrode connected to a corresponding one of said source lines, said row decoder supplies a first voltage to said selected one word line, based on the row address and a second voltage lower than said first voltage to other word lines, and said source line control circuit supplies a third voltage lower than said second voltage to the selected one source line and sets voltages of other source lines to be equal to the voltage of said bit line selected by said column decoder at writing operation.

2. The nonvolatile semiconductor memory device as claimed in claim 1, wherein said row decoder supplies said first voltage to said selected one word line, said third voltage to the other word lines subjected to a memory block containing said selected word line, and said second voltage to the word lines subjected to other memory blocks.

* * * * *